United States Patent [19]

Hasegawa et al.

[11] Patent Number: 5,895,271

[45] Date of Patent: Apr. 20, 1999

[54] METAL FILM FORMING METHOD

[75] Inventors: Kiyoshi Hasegawa, Tokyo; Hiroshi Ozaki, Saitama, both of Japan

[73] Assignee: Sony Corporation, Japan

[21] Appl. No.: 08/578,891

[22] Filed: Dec. 27, 1995

[30] Foreign Application Priority Data

Dec. 29, 1994 [JP] Japan ............... 6-340488

[51] Int. Cl.$^6$ ................................ H01L 21/00
[52] U.S. Cl. .................. 438/701; 438/713; 438/725; 438/978; 204/192.36
[58] Field of Search ............... 156/644.1, 659.11; 437/228, 229, 944, 947; 204/192.36; 438/701, 713, 725, 951, 978

[56] References Cited

U.S. PATENT DOCUMENTS

| | | | |
|---|---|---|---|
| 4,124,473 | 11/1978 | Lehmann et al. | 204/192 E |
| 4,187,331 | 2/1980 | Hsioh-Lien Ma | 430/328 |
| 4,489,101 | 12/1984 | Shibata | 437/228 |
| 4,687,541 | 8/1987 | Penney | 437/228 |
| 4,705,597 | 11/1987 | Gimpelson et al. | 156/644.1 |
| 4,758,306 | 7/1988 | Cronin et al. | 156/644.1 |
| 4,769,343 | 9/1988 | Fathimulla et al. | 437/187 |
| 4,902,377 | 2/1990 | Berglund et al. | 15/643 |
| 4,904,619 | 2/1990 | Yamada et al. | 437/190 |
| 4,986,877 | 1/1991 | Tachi et al. | 156/643 |
| 5,124,275 | 6/1992 | Selle et al. | 437/944 |
| 5,185,278 | 2/1993 | Barker | 437/228 |
| 5,190,892 | 3/1993 | Sano | 437/944 |
| 5,200,360 | 4/1993 | Bradbury et al. | 437/192 |
| 5,203,957 | 4/1993 | Yoo et al. | 156/644.1 |
| 5,288,660 | 2/1994 | Hua et al. | 437/944 |
| 5,308,415 | 5/1994 | Chou | 156/643 |
| 5,320,979 | 6/1994 | Hashimoto et al. | 437/192 |
| 5,320,981 | 6/1994 | Blalock | 437/947 |
| 5,385,634 | 1/1995 | Butler et al. | 156/644.1 |
| 5,432,119 | 7/1995 | Le et al. | 437/80 |
| 5,432,125 | 7/1995 | Misawa et al. | 437/176 |
| 5,445,979 | 8/1995 | Hirano | 437/41 |
| 5,453,403 | 9/1995 | Meng et al. | 156/644.1 |
| 5,567,650 | 10/1996 | Straight et al. | 437/195 |
| 5,583,063 | 12/1996 | Samoto | 437/40 |
| 5,629,237 | 5/1997 | Wang et al. | 438/701 |
| 5,633,197 | 5/1997 | Lur et al. | 438/668 |

FOREIGN PATENT DOCUMENTS 4-53130  2/1992  Japan .

*Primary Examiner*—R. Bruce Breneman
*Assistant Examiner*—Anita Alanko
*Attorney, Agent, or Firm*—Ronald P. Kananen

[57] ABSTRACT

A metal film forming method by which a metal film having a desired pattern can be formed with good reproducibility and satisfactory precision. In a metal film forming method for forming a metal film into the desired pattern on a surface of an object by the lift-off method, a resist layer is laminated on the surface of the object, the resist layer is exposed to light with the desired pattern and it is developed. Radio frequency sputtering is then performed against the resist layer so that the opening is deformed into a shape which is suited for the lift-off process. A metal film is then laminated on the surfaces of the resist layer and the metal film forming object. Then the resist layer is subjected to lift-off processing, whereby the metal film can be formed with good precision and satisfactory reproducibility. In this way, such a metal film forming method can be realized that a metal film having the desired pattern can be formed with good reproducibility and satisfactory precision.

12 Claims, 3 Drawing Sheets

METAL FILM FORMING METHOD

BACKGROUND OF THE INVENTION

1. Field of the Invention

This invention relates to a metal film forming method, and more particularly, is applicable to laminating a metal film on a silicon wafer in a desired pattern.

2. Description of the Related Art

Heretofore, the etching method and the lift-off method have been methods for lamination-forming a metal film on a silicon wafer in a desired pattern.

Usually, the etching method is performed such that a metal film is laminated all over the upper surface of a silicon wafer by a method such as sputtering or evaporation. A resist layer is formed on the metal film, avoiding parts which are desired to be reserved for (usually, wiring portions), and then the exposed metal film is etched via the resist layer.

On the other hand, the lift-off method is performed such that a resist layer is formed on the upper surface of a silicon wafer, avoiding parts which are desired to be reserved. A metal film is laminated all over the upper surface of the wafer which includes the upper surface of the resist layer by sputtering, evaporation, etc., and then the metal film which is lying on the resist layer is eliminated (lifted off) from the wafer together with the resist layer.

In the abovementioned conventional lift-off method, it is necessary to cause organic matter, which is used for dissolving the resist layer, to permeate the resist layer sufficiently in order to perform the lift-off process satisfactorily. For this purpose it is necessary that the shape of the cross section of each opening 2A of the resist layer 2 which is formed on the upper surface of the silicon wafer 1 is of an inverse tapered form or bottle neck form, as shown in FIG. 1A or 1B.

Heretofore, various methods have been proposed and realized using a photoresist material and process for obtaining such shapes for each opening 2A of the resist layer 2. However, there have been problems in that such methods are all costly due to the resist material used or other aspects of the methods. Reproducibility of the pattern using such methods is also poor.

SUMMARY OF THE INVENTION

In view of the foregoing, an object of this invention is to provide a metal film forming method by which a metal film having the desired pattern can be formed with good reproducibility and satisfactory precision.

The foregoing object and other objects of the invention have been achieved by the provision of a metal film forming method for forming a metal film 16 on the surface of an object 10 into the desired pattern by a lift-off method. The method comprises: the first step of forming a resist layer 15, by applying photoresist on the surface of the object 10; the second step of forming an opening 15A which is corresponding to the desired pattern on the resist layer 15, by exposing the resist layer 15 to light into the desired pattern and then developing it; the third step of deforming the opening 15A into the stated shape which is suited for a lift-off process, by performing radio frequency sputtering against the resist layer 15; the fourth step of lamination-forming a metal film 16 on the surface of the object 10 and on the resist layer 15; and the fifth step of eliminating the resist layer 15 from the surface of the object 10.

Further, in the present invention, the metal film 16 is laminated on the surface of the object 10 and on the resist layer 15 by sputtering, in the fourth step.

Further, in the present invention, the metal film 16 is laminated on the surface of the object 10 and on the resist layer 15 by vacuum evaporation, in the fourth step.

Furthermore, in the present invention, the object 10 is comprised of a semiconductor chip.

An opening 15A is deformed into the stated shape which is suited for a lift-off process by performing radio frequency sputtering against a resist layer 15 which has been formed on a surface of an object 10, so that a metal film 16 can be formed with satisfactory precision and reproducibility, in this way a metal film forming method can be realized by which the metal film having the stated pattern can be formed with good reproducibility and satisfactory precision.

The nature, principle and utility of the invention will become more apparent from the following detailed description when read in conjunction with the accompanying drawings in which like parts are designated by like reference numerals or characters.

DETAILED DESCRIPTION OF THE EMBODIMENT

Figure 1A:
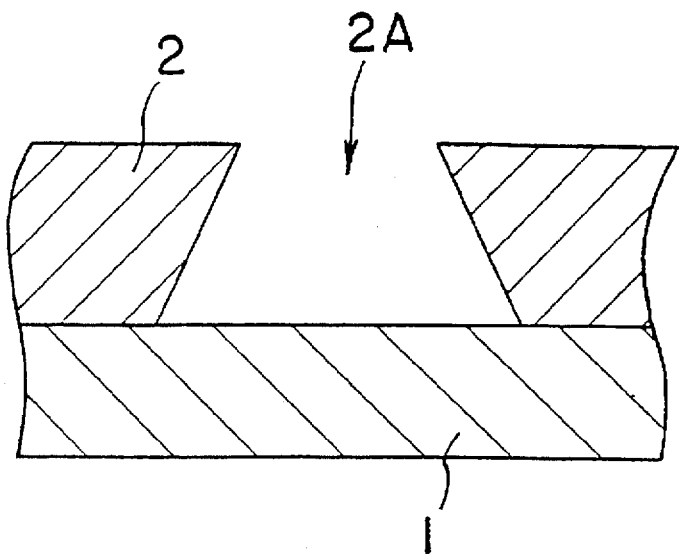
FIGS. 1A and 1B are cross sectional views explaining the shape of the opening of the resist layer at the time of forming the metal film using the lift-off method.
Figure 1B:
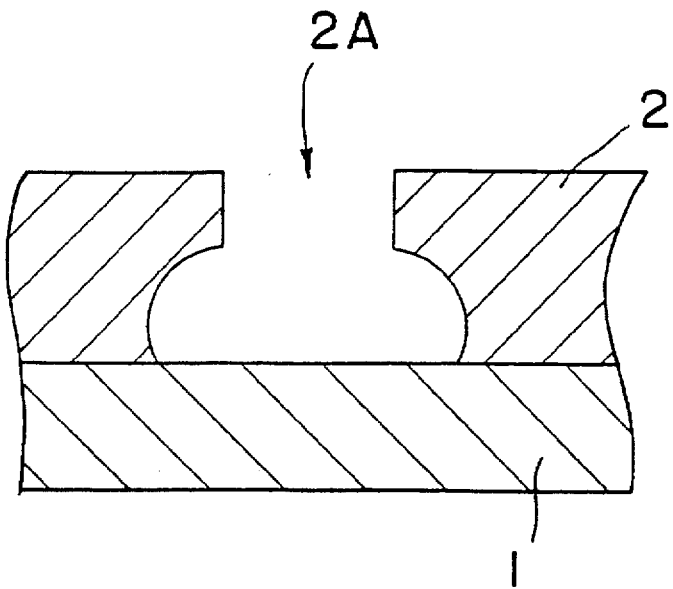
Figure 2A:
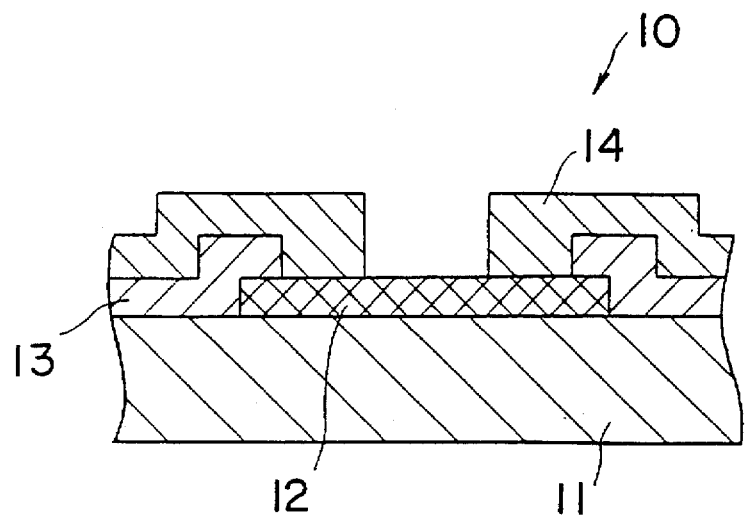
FIGS. 2A to 2C, 3A and 3B are cross sectional views explaining the metal film forming method according to the embodiment.

Preferred embodiments of this invention will be described with reference to the accompanying drawings:

FIGS. 2A to 2C, 3A and 3B show the metal film forming method according to the embodiment. At first, against a silicon wafer 11 of a semiconductor chip 10 which has been patterned into a predetermined status by the doping of impurities, etc., an electrode pad 12 is formed at a predetermined position by an existing method, and a first passivation film 13 and a second passivation film 14 are sequentially laminated on the silicon wafer 11, avoiding the electrode pad 12 (FIG. 2A).

Figure 2B:
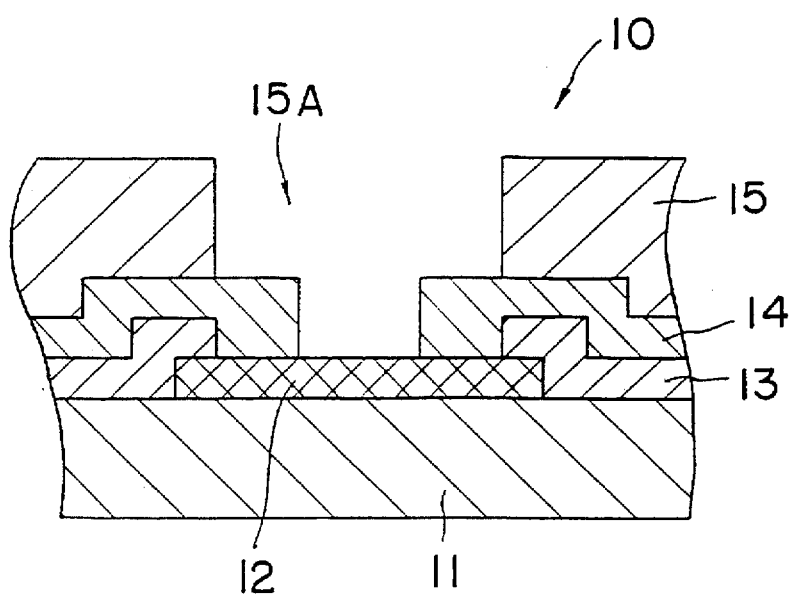

Subsequently, a resist is applied over the upper surface of the semiconductor chip 10, which is comprised of the upper surface of the second passivation film 14 and the upper surface of the electrode pad 12, so that a resist layer 15 is formed. After this, the resist layer 15 is exposed to light and then developed such that it becomes the predetermined pattern, so that the resist layer 15 lying on each electrode pad 12 is eliminated. As a result, an opening 15A which corresponds to each electrode pad 12 is formed in the resist layer 15 (FIG. 2B).

Figure 2C:
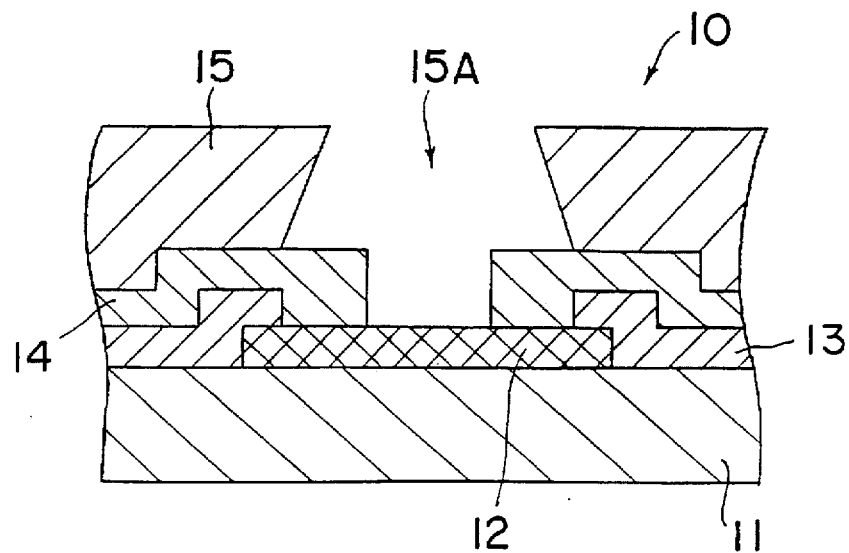

Next, radio frequency sputtering is performed against the resist layer 15 which remains on the second passivation film 14. Therefore, the resist layer 15 assumes such a shape that the closer to the top of each opening 15A one looks, the more the resist layer 15 projects into the opening 15A as shown in FIG. 2C, so that the shape of the cross section of the opening 15A becomes an inverse tapered form.

Next, a metal film 16 is laminated on the whole upper surface of the semiconductor chip 10, which is comprised of the upper surface of the resist layer 15 and the upper surface of the electrode pad 12 (FIG. 3A), and then the resist layer 15 is peeled off from the second passivation film 14 by means of an organic solvent, etc.

Figure 3A:
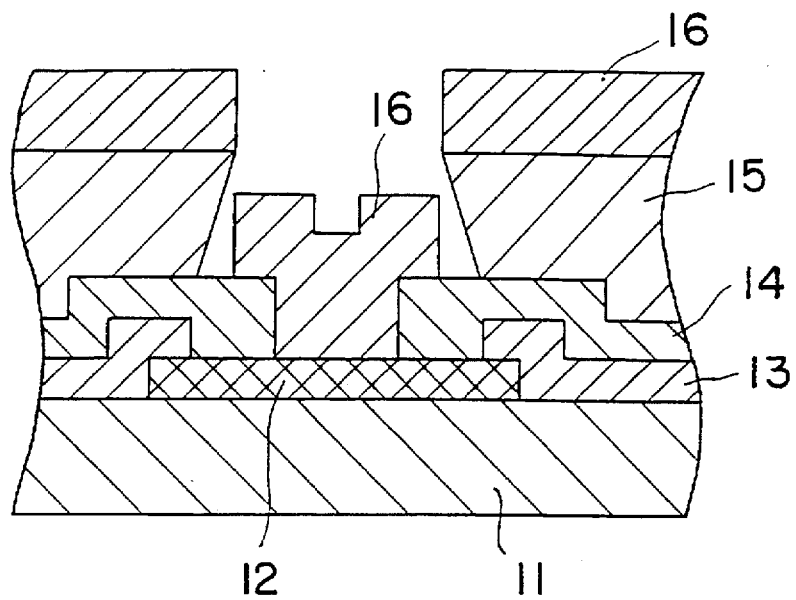
Figure 3B:
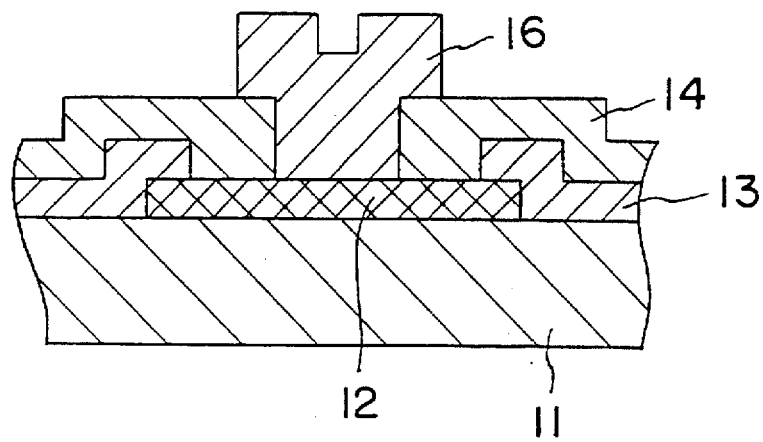

In this way, the metal film 16 can be formed, into the desired pattern, on the desired position of the upper surface of the semiconductor chip 10 (on the electrode pad 12, in this embodiment) as shown in FIG. 3B.

Using such a method, an experiment has been performed for forming the metal film 16 on the electrode pad 12 of the semiconductor chip 10, under the following conditions.

In the process of forming the electrode pad and the passivation film of FIG. 2A, the plural electrode pads 12 of 110 μm square is formed on the silicon wafer 11 with 150 μm pitch, and the first passivation film 13 is laminated on the silicon wafer 11 at 1 μm thick, and then the second passivation film 14 is laminated on the first passivation film 13 at 2 μm thick. In this case, the size of the opening, which is square in the first passivation film 13 formed on each electrode pad 12 is made to 100 μm square. The size of the opening, which is a circle, in the second passivation film 14 is made 60 μm in diameter.

In the succeeding process of forming the resist layer of FIG. 3B, the resist layer 15 is formed by applying positive photo-resist on the whole upper surface of the semiconductor chip 10 at 3.5 μm thick, and the resist layer 15 is exposed to light using a mask aligner and then developed, so that the opening 15A of 80 μm in diameter is formed in the resist layer 15 of the part which is opposed to each electrode pad 12.

Moreover, in the radio frequency sputtering process of FIG. 2C, the silicon wafer 11 is fixed on a usual sputtering device which is not shown, and, after vacuum evacuation, radio frequency sputtering with argon ions is performed. As a result, the size of each opening 15A of the resist layer 15 is about 70 μm in diameter at the upper surface.

Moreover, in the metal film forming process of FIG. 3A, chromium, copper and gold are sequentially sputtered into 100 nm, 1 μm and 100 nm thickness respectively utilizing the same sputtering device. The metal film 16 is laminated on the resist layer 15 and each electrode pad 12. Then, the resist layer 15, and the metal film 16 which is lying on the resist layer 15 are eliminated, in the resist layer removal process of FIG. 3B.

As a result, the metal film 16 of the desired size is formed on each electrode pad 12 into the desired status. In this way, it has been verified that the metal film 16 can be formed with satisfactory precision by the metal film forming method according to this embodiment.

In the above constitution, according to the metal film forming method of this embodiment, a resist layer 15 is formed by applying photoresist on a silicon wafer 11. The resist layer 15 is shaped into the desired pattern by exposing and developing it. Then, radio frequency sputtering is performed against the resist layer 15 so that the resist layer 15 is deformed into a shape which is suited to a lift-off process. Then a metal film 16 is laminated on the resist layer 15 and on an electrode pad 12 which is being exposed via an opening 15A in the resist layer 15. Then the resist layer 15 is subjected to lift-off processing. Thereby, the metal film 16 of the desired pattern is formed on the silicon wafer 11.

In this case, it is possible to adjust the quantity of deformation of the resist layer 15 by the radio frequency sputtering process of FIG. 2C. By adjusting the time and temperature during which radio frequency sputtering is performed against the resist layer 15, the metal film 16 can be formed on the silicon wafer 11 with good reproducibility and satisfactory precision.

Also, according to the metal film forming method of this embodiment, special resist material or special methods are not applied but usual resist material, etc. are used. Therefore, the metal film 16 can be formed with low cost and good precision.

According to the above constitution, in the metal film forming method based on the lift-off method, the resist layer 15 is deformed by radio frequency sputtering into a shape which is suited for a lift-off process, so that the metal film 16 can be formed with low cost, satisfactory precision and good reproducibility. In this way, a metal film forming method can be realized by which the metal film 16 which has the desired pattern can be formed with good reproducibility and satisfactory precision.

The above embodiment illustrates a case where deposition of the metal film 16 is performed by sputtering or evaporation. However, the present invention is not limited to such case, but may utilize the other various methods.

Further, the above embodiment has illustrated a case where the present invention is applied to forming the metal film 16 on the electrode pad 12 of the semiconductor chip 10. However, the present invention is not limited to such case, but can be applied to forming of the metal film 16 at places other than the electrode pad 12 of the semiconductor chip 10, and also may be applied to forming of a metal film on any material (such as a substrate) other than the semiconductor chip 10.

As described above, according to the present invention, in a metal film forming method for forming a metal film into a desired pattern on the surface of an object by the lift-off method, a resist layer is laminated on the surface of the object, the resist layer is exposed to light with the desired pattern and it is developed. Radio frequency sputtering is then performed against the resist layer so that the opening is deformed into a shape which is suited for the lift-off process, and a metal film is then laminated on the surfaces of the resist layer and the object.

Then the resist layer is subjected to lift-off processing, whereby the metal film 16 can be formed with good precision and satisfactory reproducibility. In this way, such a metal film forming method can be realized that the metal film having the desired pattern can be formed with good reproducibility and satisfactory precision.

While the foregoing description is in connection with the preferred embodiments of the invention, it will be obvious to those skilled in the art that various changes and modifications may be made. Therefore the scope of appended claims aims to cover all such changes and modifications as fall within the true spirit and scope of the invention.

What is claimed is:

1. A metal film forming method for forming a metal film in a pattern on a surface of an object, said forming method comprises the steps of:

forming a resist layer by applying photoresist to said surface of said object;

forming at least one opening in said resist layer which has sides and corresponds to said pattern, wherein said step of forming at least one opening comprises exposing said resist layer to light which corresponds to said pattern and then developing said resist layer;

deforming said at least one opening by reducing a diameter of upper portions of said at least one opening such that said opening increases in size in the direction of said object, wherein said deforming is accomplished by sputtering;

laminating a metal film on said surface of said object and on said resist layer; and eliminating said resist layer and said metal film laminated thereon from said surface of said object.

2. The metal film forming method according to claim 1, wherein said step of laminating said metal film is performed by sputtering.

3. The metal film forming method according to claim 1, wherein said step of laminating said metal film is performed by vacuum evaporation.

4. The metal film forming method according to claim 1, wherein said object is a semiconductor chip.

5. The metal film forming method according to claim 1, wherein said sputtering is radio-frequency sputtering.

6. The metal film forming method according to claim 1, wherein said step of forming a resist layer is preceded by the steps of:

forming at least one electrode pad on said object;

forming a first passivation layer on said object with at least one opening therein corresponding to said at least one electrode pad; and forming a second passivation layer on said first passivation layer with at least one opening therein corresponding to said at least one electrode pad.

7. The metal film forming method according to claim 6, wherein said at least one opening corresponds to said at least one electrode pad.

8. The metal film forming method according to claim 1, wherein said step of eliminating is performed with an organic solvent.

9. The metal film forming method according to claim 1, wherein said step of deforming results in a tapered opening.

10. The metal film forming method according to claim 6, wherein said at least one opening in said first passivation layer in square.

11. The metal film forming method according to claim 6, wherein said at least one opening in said second passivation layer is circular.

12. A metal film forming method for forming a metal film in a pattern on a surface of an object, said forming method comprising the steps of:

forming a resist layer by applying photoresist on said surface of said object;

forming at least one opening in said resists layer which has sides and corresponds to said pattern;

deforming said at least one opening by radio frequency sputtering such that, after said deforming, said at least one opening increases in size toward said object;

laminating a metal film on said surface of said object and on said resist layer; and eliminating said resist layer on said metal film laminated thereon from said surface of said object.

* * * * *

UNITED STATES PATENT AND TRADEMARK OFFICE
CERTIFICATE OF CORRECTION

PATENT NO. : 5,895,271
DATED : April 20, 1999
INVENTOR(S) : Kiyoshi HASEGAWA and Hiroshi OZAKI It is certified that error appears in the above-identified patent and that said Letters Patent is hereby corrected as shown below:

Claim 10 should read:

10. The metal film forming method according to claim 6, wherein said at least one opening in said first passivation layer is square.

Signed and Sealed this

Eleventh Day of January, 2000

Q. TODD DICKINSON

*Attest:*

*Attesting Officer*  Acting Commissioner of Patents and Trademarks